(12) United States Patent
Hull et al.

(10) Patent No.: US 9,105,666 B2
(45) Date of Patent: Aug. 11, 2015

(54) METHODS OF FABRICATING SEMICONDUCTOR STRUCTURES

(71) Applicant: Micron Technology, Inc., Boise, ID (US)

(72) Inventors: Jeffery B. Hull, Boise, ID (US); John M. Meldrim, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 14/494,175

(22) Filed: Sep. 23, 2014

(65) Prior Publication Data

US 2015/0011063 A1    Jan. 8, 2015

Related U.S. Application Data

(62) Division of application No. 13/738,457, filed on Jan. 10, 2013, now Pat. No. 8,877,624.

(51) Int. Cl.
| | |
|---|---|
| H01L 29/66 | (2006.01) |
| H01L 29/40 | (2006.01) |
| H01L 21/02 | (2006.01) |
| H01L 21/28 | (2006.01) |
| H01L 29/423 | (2006.01) |
| H01L 29/49 | (2006.01) |
| H01L 29/51 | (2006.01) |
| H01L 29/788 | (2006.01) |
| H01L 27/115 | (2006.01) |

(52) U.S. Cl.
CPC .... *H01L 29/66825* (2013.01); *H01L 21/02178* (2013.01); *H01L 21/28035* (2013.01); *H01L 27/11556* (2013.01); *H01L 29/401* (2013.01); *H01L 29/42324* (2013.01); *H01L 29/4916* (2013.01); *H01L 29/511* (2013.01); *H01L 29/517* (2013.01); *H01L 29/518* (2013.01); *H01L 29/7889* (2013.01)

(58) Field of Classification Search
None
See application file for complete search history.

(56) References Cited

U.S. PATENT DOCUMENTS

| | | | |
|---|---|---|---|
| 7,655,971 B2 | 2/2010 | Ino et al. | |
| 8,129,775 B2 | 3/2012 | Akiyama et al. | |
| 2009/0147576 A1 | 6/2009 | Matamis et al. | |
| 2009/0173981 A1 | 7/2009 | Nitta | |
| 2009/0181530 A1 | 7/2009 | Lisiansky et al. | |
| 2011/0298038 A1 | 12/2011 | Son et al. | |
| 2012/0205722 A1* | 8/2012 | Lee et al. | 257/211 |
| 2013/0056820 A1* | 3/2013 | Jeong | 257/324 |
| 2014/0193969 A1 | 7/2014 | Hull et al. | |

* cited by examiner

*Primary Examiner* — Alexander Ghyka
*Assistant Examiner* — Stanetta Isaac
(74) *Attorney, Agent, or Firm* — TraskBritt

(57) ABSTRACT

Semiconductor structures including an etch stop material between a substrate and a stack of alternating insulating materials and first conductive materials, wherein the etch stop material comprises an amorphous aluminum oxide on the substrate and a crystalline aluminum oxide on the amorphous aluminum oxide; a channel material extending through the stack; and a second conductive material between the channel material and at least one of the first conductive materials in the stack of alternating insulating materials and first conductive materials, wherein the second conductive material is not between the channel material and the etch stop material. Also disclosed are methods of fabricating such semiconductor structures.

20 Claims, 6 Drawing Sheets

METHODS OF FABRICATING SEMICONDUCTOR STRUCTURES

CROSS-REFERENCE TO RELATED APPLICATION

This application is a divisional of U.S. patent application Ser. No. 13/738,457, now U.S. Pat. No. 8,877,624, issued Nov. 4, 2014, the disclosure of which is hereby incorporated herein in its entirety by this reference.

FIELD

The present disclosure, in various embodiments, relates generally to semiconductor device design and fabrication. More particularly, the present disclosure relates to design and fabrication of memory devices having three-dimensionally arranged memory cells.

BACKGROUND

Semiconductor memory devices may be classified into volatile memory devices and nonvolatile memory devices. In contrast to volatile memory devices, nonvolatile memory devices, such as flash memory devices, retain stored data even when power is removed. Therefore, nonvolatile memory devices, such as flash memory devices, are widely used in memory cards and in electronic devices such as mobile communication terminals.

Flash memory devices have been used in a wide range of electronic applications, such as portable computers, personal digital assistants (PDAs), digital cameras, portable music players, and cellular telephones. A conventional flash memory has a memory array that includes a large number of memory cells arranged in row and column fashion. Each of the memory cells includes a floating gate field-effect transistor configured to hold a charge. The memory cells are usually grouped into blocks. Each of the cells within a block can be electrically programmed in a random basis by charging the floating gate. The charge can be removed from the floating gate by a block erase operation. The data in a cell is determined by the presence or absence of the charge in the floating gate. Flash memory devices may be classified as NAND type and NOR type devices according to the structure of their cell arrays. In NOR flash devices, a column of memory cells are coupled in parallel with each memory cell coupled to a bit line. In NAND flash devices, a column of memory cells are coupled in series with only the first memory cell of the column coupled to a bit line.

Due to rapidly growing digital information technology, there are demands to continuingly increase the memory density of the flash memory devices while maintaining, if not reducing, the size of the devices. Three dimensional (3D)-NAND flash memory devices have been investigated for increasing the memory density.

Fabrication of a conventional 3D-NAND flash memory device requires creating high aspect ratio openings (e.g., an aspect ratio of at least 20:1) in a stack of alternating insulating materials and conductive materials on a substrate. The openings are formed by etching the stack of alternating insulating materials and conductive materials. To prevent etching of the substrate, an etch stop material is present between the substrate and the stack of alternating materials. However, selecting a material as the etch stop that meets stringent wet clean selectivity requirements is a challenge. When amorphous aluminum oxide is used as the etch stop material, recesses formed in the amorphous aluminum oxide may become filled with polysilicon during later processing acts. The undesirable residual polysilicon in these recesses jeopardizes the controllability of the channel characteristics and the reliability of the 3D-NAND flash memory device. Therefore, it would be beneficial to have an etch stop material that meets stringent wet clean selectivity requirements and minimizes, if not eliminates, the formation of the residual polysilicon in the recesses in the amorphous aluminum oxide.

DETAILED DESCRIPTION

Figure 1:
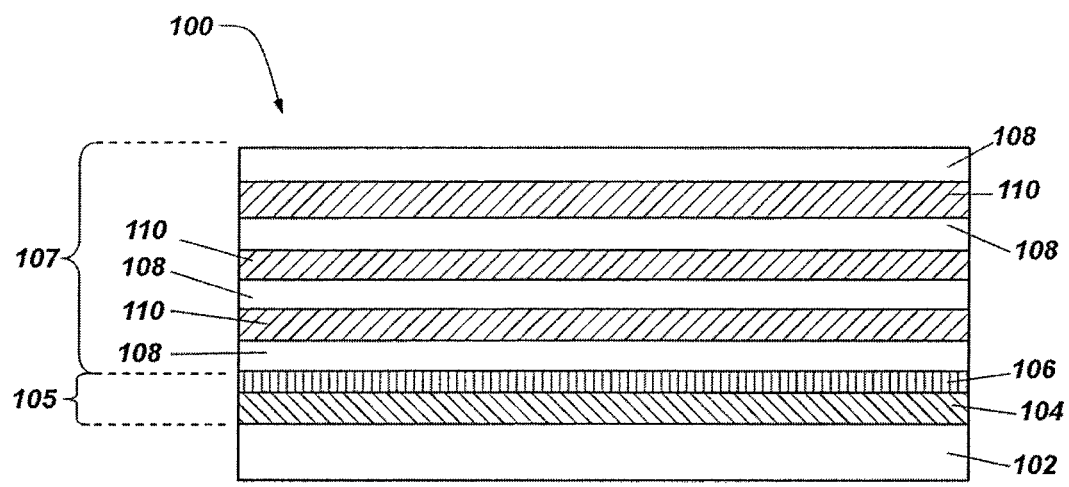
FIGS. 1-12 are cross-sectional views of various stages in the formation of a semiconductor structure having an etch stop material comprising amorphous aluminum oxide and crystalline aluminum oxide, according to an embodiment of the present disclosure.

The following description provides specific details, such as material types, material thicknesses, and processing conditions in order to provide a thorough description of embodiments of the disclosure. However, a person of ordinary skill in the art will understand that embodiments of the present disclosure may be practiced without employing these specific details. Indeed, the embodiments of the present disclosure may be practiced in conjunction with conventional fabrication techniques employed in the industry.

In addition, the description provided herein does not form a complete process flow for forming a semiconductor device structure, and the semiconductor device structures described below do not foam a complete semiconductor device. Only those process acts and structures necessary to understand the embodiments of the present disclosure are described in detail below. Additional acts to form the complete semiconductor device may be performed by conventional fabrication techniques. Also, the drawings accompanying the application are for illustrative purposes only, and are thus not drawn to scale. Elements common between figures may retain the same numerical designation. Furthermore, while the materials described and illustrated herein may be formed as layers, the materials are not limited thereto and may be formed in other three-dimensional configurations.

As used herein, any relational teems, such as "first," "second" and "third," or "top" and "bottom," are used for clarity and convenience in understanding the present disclosure and accompanying drawings and do not connote or depend on any specific preference, orientation or order. It is understood that although the terms "first," "second" and "third" are used herein to describe various elements, these elements should not be limited by these terms. These terms are only used to distinguish one element from another.

As used herein, the term "substantially," in reference to a given parameter, property or condition, means to a degree that one of ordinary skill in the art would understand that the given parameter, property, or condition is met with a small degree of variance, such as within acceptable manufacturing tolerances.

Embodiments of the present disclosure relate to semiconductor structures, such as flash memory devices (e.g., 3D-NAND flash memory devices), having an etch stop material that includes an amorphous aluminum oxide and a crystalline aluminum oxide, and to methods of fabricating these structures. By utilizing aluminum oxide exhibiting two different structures, portions of the etch stop material may be selectively etchable. As used herein, the term "selectively etchable" means and includes removing the amorphous aluminum oxide at an etch rate of at least approximately two times greater than that of the crystalline aluminum oxide when exposed to the same etch chemistry. In one embodiment, the amorphous aluminum oxide exhibits an etch rate of at least approximately ten times greater than that of the crystalline aluminum oxide when exposed to the same etch chemistry, such as a wet etch chemistry.

As described below, the etch stop material may be used in the preparation of semiconductor structures, such as 3D-NAND flash memory devices. However, it will be readily apparent to one of ordinary skill in the art that the materials and processes described herein may be used in various other applications. In other words, the etch stop material of the present disclosure may be used in other applications where it is desirable to selectively remove one component (e.g., portion) of the etch stop material relative to other components (e.g., portions) of the etch stop material using a wet etch process.

FIGS. 1-12 are cross-sectional views of various stages of forming a plurality of floating gates for 3D-NAND flash memory device according to an embodiment of the present disclosure.

FIG. 1 shows a semiconductor structure 100 including a substrate 102, a stack 107 of alternating insulating materials 108 and first conductive materials 110, and an etch stop material 105 between the substrate 102 and the stack 107 of alternating insulating materials 108 and first conductive materials 110. The insulating materials 108 may comprise oxide-based materials and the first conductive materials 110 may comprise polysilicon-based materials. The etch stop material 105 includes an amorphous aluminum oxide 104 in contact with the substrate 102, and a crystalline aluminum oxide 106 in contact with the amorphous aluminum oxide 104. In some embodiments, the crystalline aluminum oxide 106 may be positioned between the amorphous aluminum oxide 104 and the lowermost insulating material 108 of the stack 107 of alternating insulating materials 108 and first conductive materials 110, as shown in FIG. 1. Alternatively, in some embodiments, the crystalline aluminum oxide 106 may be positioned between the amorphous aluminum oxide 104 and the lowermost conductive materials 110 of the stack 107 of alternating insulating materials 108 and first conductive materials 110. Due to their different crystalline structures, the amorphous aluminum oxide 104 and crystalline aluminum oxide 106 may be selectively etchable with respect to each other in that the amorphous aluminum oxide 104 is removed at a faster rate than the crystalline aluminum oxide 106. By way of example, the amorphous aluminum oxide 104 may be removed, e.g., etched, at an etch rate of at least approximately two times greater than that of the crystalline aluminum oxide 106 when exposed to the same etch chemistry. In one embodiment, the amorphous aluminum oxide 104 has an etch rate of at least approximately ten times greater than that of the crystalline aluminum oxide 106 when exposed to the same etch chemistry, such as a wet etch chemistry.

As used herein, the term "substrate" means and includes a base material or construction upon which additional materials are formed. The substrate may be a semiconductor substrate, a base semiconductor material on a supporting structure, a metal electrode or a semiconductor substrate having one or more materials, structures or regions formed thereon. The substrate may be a conventional silicon substrate, or other bulk substrate comprising a layer of semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. The substrate may be doped or undoped. Furthermore, when reference is made to a "substrate" in the following description, previous process stages may have been utilized to form materials, regions, or junctions in the base semiconductor structure or foundation. In one embodiment, the substrate is a silicon-containing material, such as a silicon substrate.

As shown in FIG. 1, the semiconductor structure 100 may include blanket films of the respective materials. The amorphous aluminum oxide 104 and crystalline aluminum oxide 106 may be formed on the substrate 102 by any conventional method including, but not limited to, chemical vapor deposition (CVD), atomic layer deposition (ALD), physical vapor deposition (PVD), or combinations thereof. In one embodiment, the amorphous aluminum oxide 104 and crystalline aluminum oxide 106 may be formed by PVD. The etch stop material 105 including the amorphous aluminum oxide 104 and crystalline aluminum oxide 106 may be formed at any thickness sufficient for the material to function as an etch stop while a dry etching process is performed on the semiconductor structure 100. The thickness of the etch stop material 105 (e.g., the combined thickness of the amorphous aluminum oxide 104 and the crystalline aluminum oxide 106) may be about equal to the thickness of a conventional amorphous aluminum oxide material utilized as an etch stop material. The thickness of the amorphous aluminum oxide 104 may account for a majority of the thickness of the etch stop material 105, with the crystalline aluminum oxide 106 accounting for the remainder of the thickness.

In some embodiments, the formation of amorphous aluminum oxide 104 may be conducted in a different reaction chamber from the formation of crystalline aluminum oxide 106. By way of non-limiting example, the amorphous aluminum oxide 104 may be formed on the surface of the substrate 102 in a first chamber, and then the crystalline aluminum oxide 106 may be formed on the amorphous aluminum oxide 104 in a second chamber. Alternatively, the amorphous aluminum oxide 104 and crystalline aluminum oxide 106 may be formed in the same reaction chamber, where the amorphous aluminum oxide 104 may be formed on the surface of the substrate 102, followed by the formation of the crystalline aluminum oxide 106 on the amorphous aluminum oxide 104. Various process conditions may be used to form the aluminum oxide in the desired state (amorphous or crystalline) and at a desired thickness. By way of non-limiting example, the process conditions may include adjusting the deposition temperature, the components and ratio of the components of a sputter gas, or the applied energy. In some embodiments, aluminum oxide may be deposited using an aluminum oxide target and argon as a sputter gas. In other embodiments, an aluminum target may be used with a mixture of argon and oxygen as a sputter gas. In some embodiments, the amorphous aluminum oxide 104 may be formed by a PVD process at a temperature up to about 450° C. In some embodiments, the crystalline aluminum oxide 106 may be formed by pulse DC sputtering an aluminum target. In still further embodiments, an initial amorphous aluminum oxide 104 may be fanned, and chamber temperature increased to about 600° C. to transform an upper portion of the amorphous aluminum oxide 104 to crystalline aluminum oxide 106.

Any conventional method for forming the stack 107 of alternating first insulating materials 108 and first conductive materials 110 may be used and, therefore, is not described in detail herein. Any known electrically insulating material may be used for the first insulating material 108. By way of non-limiting example, the first insulating material 108 may comprise silicon oxide, silicon nitride, silicon oxynitride, or another high-k insulating material. In one embodiment, the first insulating material 108 is silicon oxide. In one embodiment, the first conductive material 110 is polysilicon. The polysilicon may be n-doped polysilicon, p-doped polysilicon, or undoped polysilicon.

Figure 2:
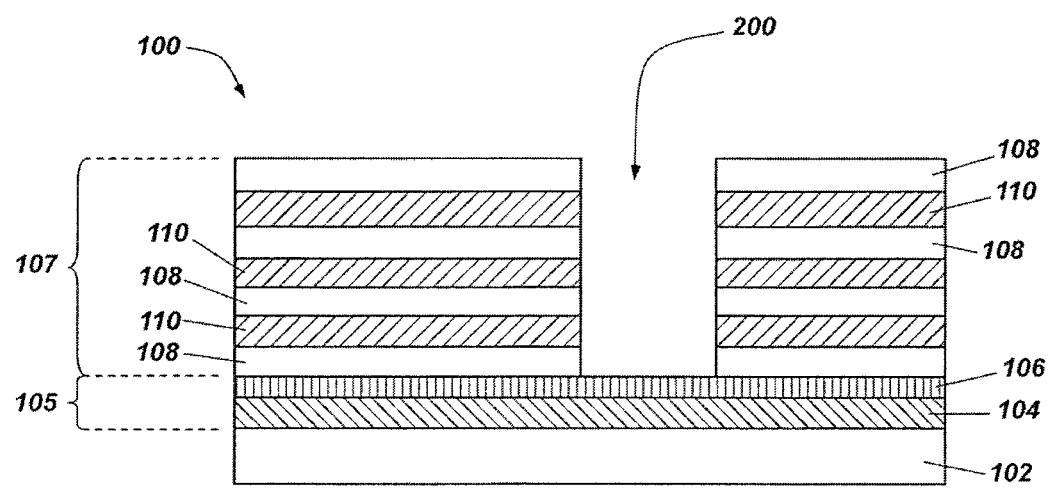

Referring to FIG. 2, the semiconductor structure 100 of FIG. 1 is subjected to an anisotropic dry etch process to create an opening 200 through the stack 107 of alternating insulating materials 108 and first conductive materials 110, exposing the surface of the crystalline aluminum oxide 106. Since the dry etch process is selective for the materials of the stack 107 of alternating insulating materials 108 and first conductive materials 110, the dry etch process may not substantially remove the crystalline aluminum oxide 106 of the etch stop 105. The opening 200 may be formed using any conventional dry etch chemistry (i.e., a reactive ion etch), which is not described in detail herein. In one embodiment, the opening 200 has an aspect ratio of at least 20:1. The semiconductor structure 100 may include one opening 200 or more than one openings in the substrate 102.

Figure 3:
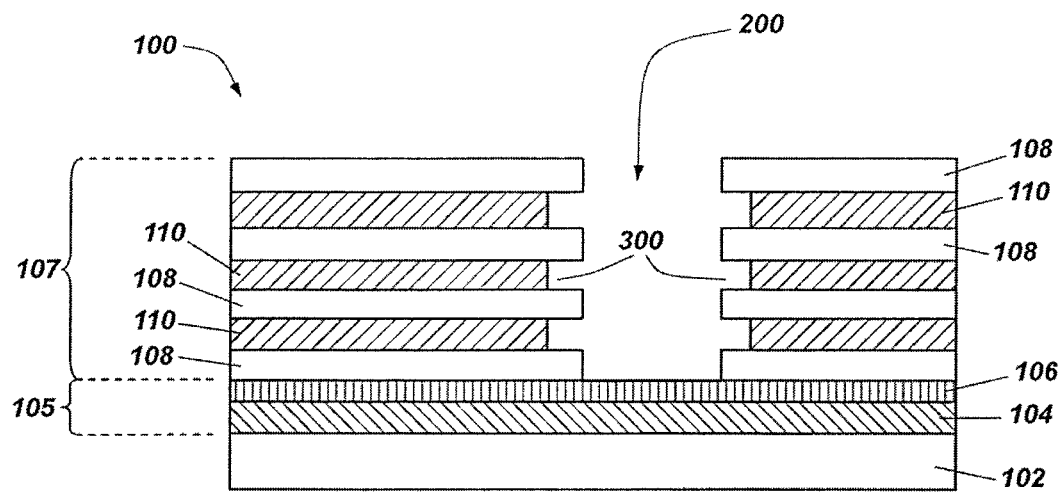

As shown in FIG. 3, at least a portion of each of the first conductive materials 110 of the stack 107 of alternating insulating materials 108 and first conductive materials 110 may be selectively removed relative to adjacent insulating materials 108 to create a plurality of first recesses 300 adjacent the first conductive materials 110. The first recesses 300 may be formed by laterally removing portions of the first conductive materials 110. Following the removal, the first insulating materials 108 may extend beyond the remaining first conductive materials 110, providing upper and lower boundaries of the first recesses 300. In some embodiments, the selective removal of the first conductive material 110 may be achieved by wet etching the semiconductor structure 100 using a solution of tetramethylammonium hydroxide (TMAH).

Figure 4:
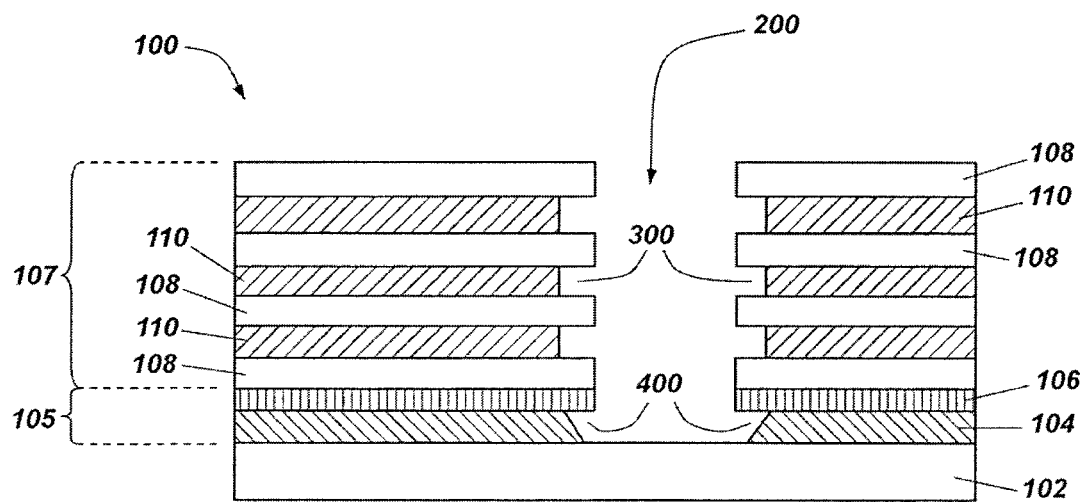

After removing a portion of the crystalline aluminum oxide 106, the semiconductor structure 100 is subjected to a wet etch process to expose the surface of the substrate 102 as shown in FIG. 4. The wet etch process removes the amorphous aluminum oxide 104 at a substantially faster rate than the crystalline aluminum oxide 106, providing a selective removal of the amorphous aluminum oxide 104 and resulting in formation of second recesses 400 adjacent the amorphous aluminum oxide 104. While FIG. 4 illustrates that sidewalls of the amorphous aluminum oxide 104 may be sloped following the wet etch process, the sidewalls may in practice be substantially vertical, depending on the wet etch process used. The second recesses 400 may be formed proximal to an interface between the amorphous aluminum oxide 104 and the crystalline aluminum oxide 106. Due to the etch selectivity for amorphous aluminum oxide 104 over crystalline aluminum oxide 106 in forming second recesses 400, the crystalline aluminum oxide 106 may laterally extend over the amorphous aluminum oxide 104. Any suitable wet etch chemistry may be used to remove the portion of the amorphous aluminum oxide 104. In some embodiments, an aqueous solution of dilute hydrofluoric acid at a 2000:1 ratio (deionized water: HF) may be used.

FIGS. 3 and 4 show that the selective removal of the first conductive material 110 to form the first recesses 300 may be performed prior to the removal of the crystalline aluminum oxide 106 and the amorphous aluminum oxide 104 to expose the surface of the substrate 102. One of ordinary skill understands that, alternatively, the removal of the crystalline aluminum oxide 106 and the amorphous aluminum oxide 104 to expose the surface of the substrate 102 may be performed prior to the selective removal of the first conductive material 110.

Figure 5:
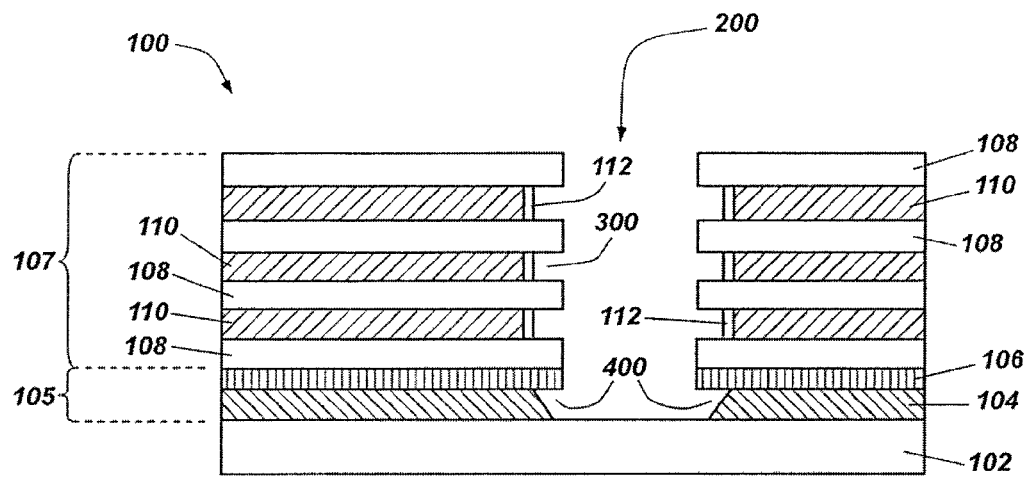

Referring to FIG. 5, a first dielectric material 112, such as an oxide material, may be selectively formed over the sidewalls of the first conductive materials 110 in the plurality of the first recesses 300. In some embodiments, the first dielectric material 112 may be silicon oxide. Any conventional method for forming a dielectric material may be used. By way of non-limiting example, the dielectric material may be grown or formed by chemical vapor deposition (CVD), atomic layer deposition (ALD), physical vapor deposition (PVD), or combinations thereof. To selectively form the first dielectric material 112, the first dielectric material 112 may be grown on the first conductive material 110. Thus, sidewalls of the first insulating materials 108, the crystalline aluminum oxide 106, and the amorphous aluminum oxide 104 may remain substantially free of the first dielectric material 112.

Figure 6:
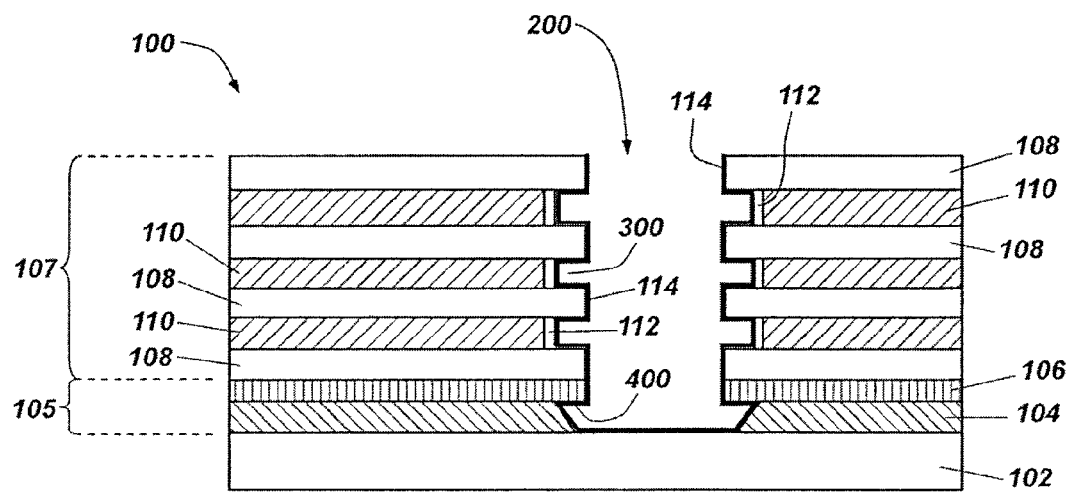

In FIG. 6, a second dielectric material 114 such as a nitride material is formed substantially conformally on the exposed surfaces of the insulating materials 108, the first dielectric materials 112 in the plurality of the first recesses 300, the crystalline aluminum oxide 106, and the amorphous aluminum oxide 104. Additionally, the second dielectric material 114 may be formed conformally on the floor of the opening 200. As shown in FIG. 6, the second dielectric material 114 occupies at least a portion of the volume of the second recesses 400, reducing the volume of the second recesses 400. In some embodiments, the second dielectric material 114 is silicon nitride. Any conventional method for foaming the nitride material may be used and, therefore, is not described in detail herein.

Figure 7:
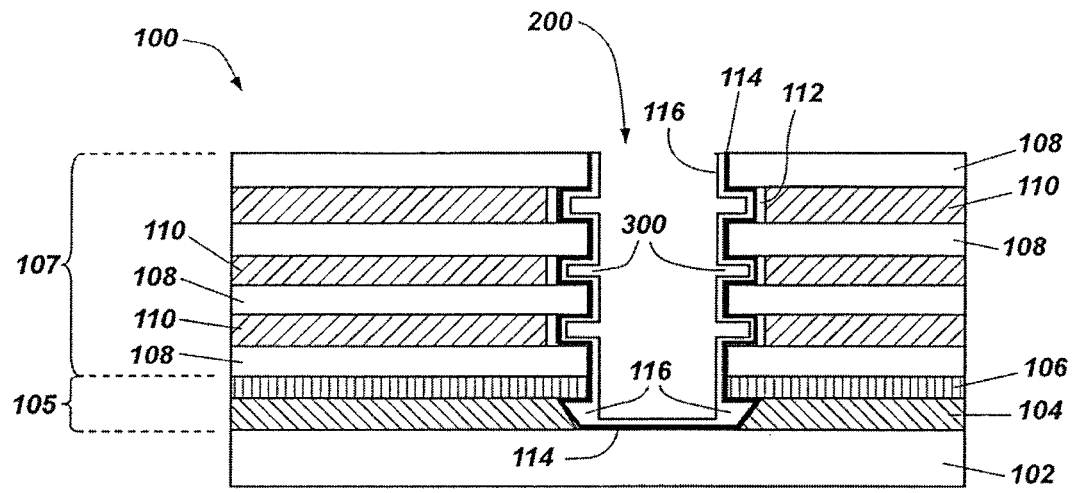

A third dielectric material 116 may be formed substantially conformally over the second dielectric material 114, providing the semiconductor structure 100 of FIG. 7. The third dielectric material 116 may be formed over the second dielectric material 114 to substantially fill the volume of the second recesses 400 proximal the interface between the amorphous aluminum oxide 104 and the crystalline aluminum oxide 106. Since the volume of the second recesses 400 is substantially filled with the material comprising the second dielectric material 114 and the third dielectric material 116, subsequently formed materials, such as a second conductive material, cannot fill the second recesses 400. Therefore, the formation of undesirable residual polysilicon in the second recesses 400 may be minimized, if not eliminated. Any conventional method for forming the third dielectric material 116 may be used, such as chemical vapor deposition (CVD), atomic layer deposition (ALD), physical vapor deposition (PVD), or combinations thereof. The third dielectric material 116 may include silicon oxide, silicon nitride, silicon oxynitride, or another high-k insulating material. In some embodiments, the third dielectric material 116 is silicon oxide. The first and third dielectric materials 112, 116, respectively, may be independently selected so that the same or different materials are used. Depending on the materials selected, the semiconductor structure 100 may include an oxide-nitride-oxide (ONO) structure material of the third dielectric oxide material 116—the second dielectric nitride material 114—the first dielectric oxide material 112 on at least the area proximate the first recesses 300 on the sidewalls of the opening 200. In some embodiments, the thickness of the ONO structure may be about 150 Å.

The thicknesses of the second dielectric material 114 and the third dielectric material 116 may be selected to substantially occupy the volume of the second recesses 400. In some embodiments, the depth of the second recesses 400, which is dependent on the thickness of the amorphous aluminum oxide 104, may be about twice the combined thicknesses of the second dielectric material 114 and the third dielectric material 116, or less.

Figure 8:
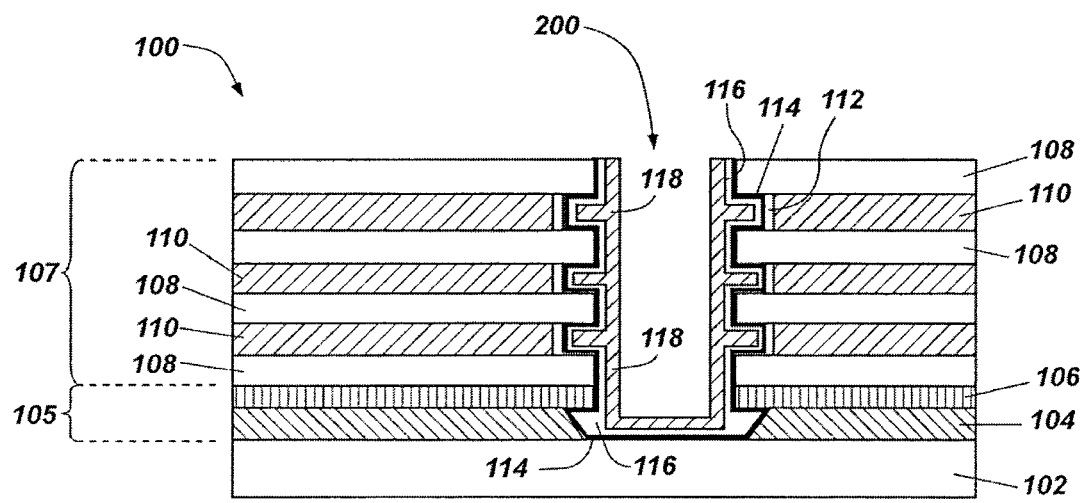

Referring to FIG. 8, a second conductive material 118 may be formed over the third dielectric material 116 to fill the remaining volume of the plurality of the first recesses 300. By way of non-limiting example, the second conductive material 118 may comprise silicon, germanium, or silicon germanium. In one embodiment, the second conductive material 118 is polysilicon, such as n-doped polysilicon, p-doped polysilicon, or undoped polysilicon. The first and second conductive materials 110, 118, respectively, may be independently selected so that the same or different conductive materials are used. In one embodiment, the first and second conductive materials 110, 118 are polysilicon. Any conventional method for forming the second conductive material 118 may be used and, therefore, is not described in detail herein.

As the second recesses 400 are already substantially filled with the second dielectric material 114 and the third dielectric material 116, the second conductive material 118 may not form in the second recesses 400. Therefore, the formation of undesirable residual polysilicon in the second recesses 400 may be minimized, if not eliminated.

Figure 9:
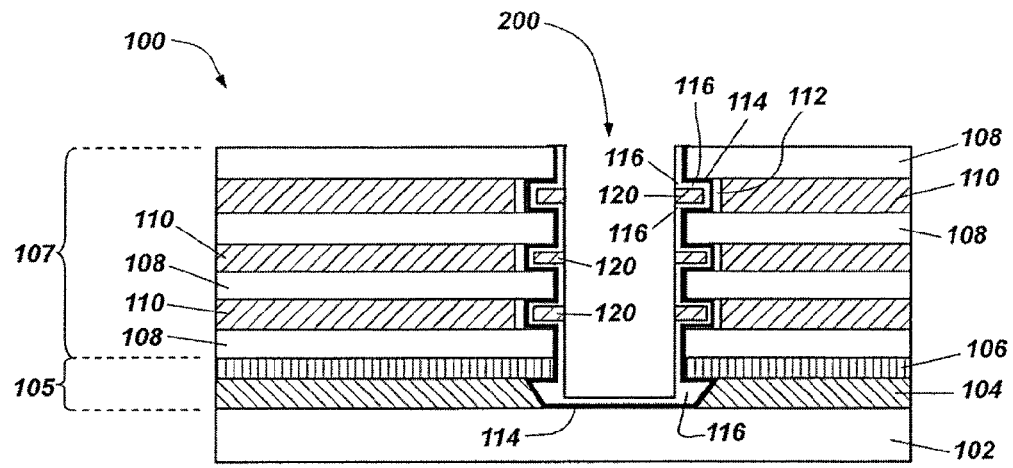

Portions of the second conductive material 118 adjacent the first insulating materials 108, the etch stop material 105, and the substrate 102 may be removed, leaving the second conductive material 120 only in the first recesses 300, as shown in FIG. 9. Thus, the semiconductor structure 100 includes a plurality of floating gates 120 that are discrete and isolated from one another by the third dielectric material 116—the second dielectric material 114—the first dielectric material 112, and the insulating material 108.

The removal of the second conductive material 118 may be achieved by conventional methods, such as by a wet etch process, dry etch process, or a combination thereof. A dry etch may be performed with a high bias power. In some embodiments, portions of the second conductive material 118 may be removed by a vapor etch process. The method of removing the second conductive material 118 may depend on the types of material used for the second conductive material 118. For example, an n-doped conductive material may be removed by a different process from a p-doped or undoped conductive material. In some embodiments, a solution of tetramethylammonium hydroxide (TMAH) may be used for the wet etch process. In some embodiments, a mixture of fluorine ($F_2$) and ammonia ($NH_3$) gases may be used for the vapor etch process.

Figure 10:
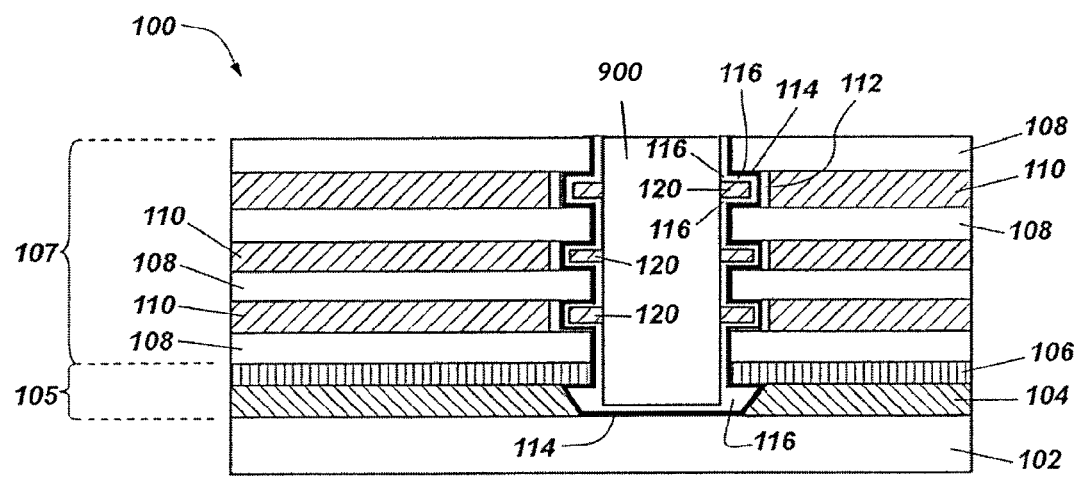

Referring to FIG. 10, a channel material 900 may be formed in at least one opening 200. By way of non-limiting example, the channel material 900 may be a pillar of conductively doped polysilicon. Any conventional method for forming the channel material 900 may be used and, therefore, is not described in detail herein.

Figure 11:
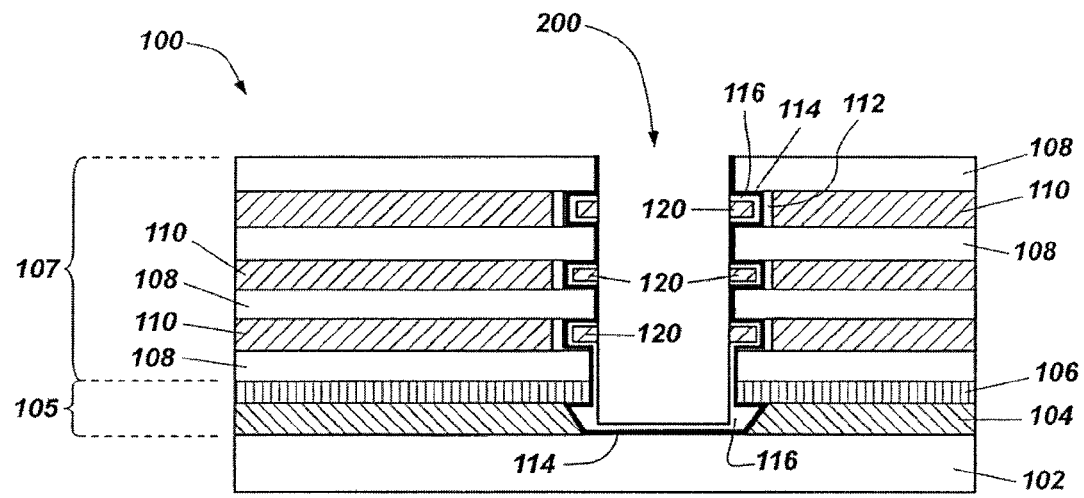
Figure 12:
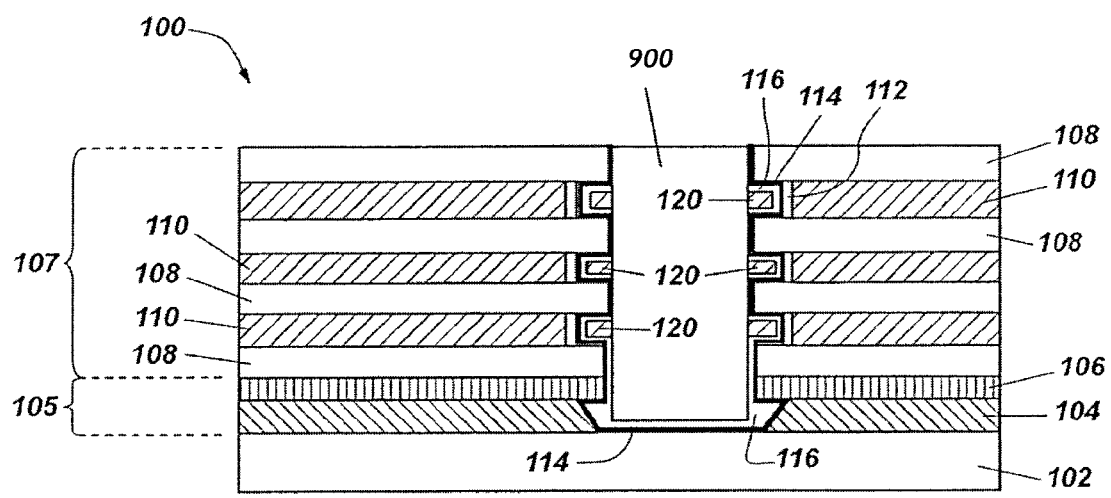

As shown in FIG. 11, in some embodiments, at least a portion of the exposed third dielectric material 116 on the opening 200 may be removed. In addition, portions of the second conductive material 118 and third dielectric material 116 in the first recesses 300 may be removed so that exposed surfaces of the second conductive material 120 are planar with exposed surfaces of the second dielectric material 114. For example, the second conductive material 118 and the third dielectric material 116 may be anisotropically dry or wet etched in a single act or in multiple acts to leave the second conductive material 120 only in the first recesses 300. In FIG. 12, the channel material 900 is formed in at least one opening 200.

The semiconductor structure 100 of FIGS. 10 and 12 may be subjected to further semiconductor processing. In one embodiment, the semiconductor structure 100 may be further processed by conventional techniques to form a 3D-NAND flash memory device.

A semiconductor structure may comprise an etch stop material between a substrate and a stack of alternating insulating materials and first conductive materials, wherein the etch stop material comprises an amorphous aluminum oxide on the substrate and a crystalline aluminum oxide on the amorphous aluminum oxide; a channel material extending through the stack; and a second conductive material between the channel material and at least one of the first conductive materials in the stack of alternating insulating materials and first conductive materials, without the second conductive material between the channel material and the etch stop material.

A semiconductor structure may comprise an etch stop material between a substrate and a stack of alternating oxide-based materials and polysilicon-based materials, the etch stop material comprising an amorphous aluminum oxide in contact with the substrate and a crystalline aluminum oxide in contact with the stack of the alternating oxide-based materials and polysilicon-based materials; a channel material extending through the stack; and a polysilicon-based material between the channel material and at least one of the polysilicon-based materials in the stack of alternating oxide-based materials and polysilicon-based materials, without the polysilicon-based material between the channel material and the etch stop material.

FIGS. 1-12 illustrate one embodiment of the methods of forming a plurality of floating gates for 3D-NAND devices, and do not necessarily limit the numbers of alternating insulating materials 108 and first conductive materials 110 in the stack 107. In addition, the locations, numbers, and shapes of the floating gates 120, or the profile and shape of the opening 200 over the substrate 102 are not limited to the illustrated embodiment.

Additionally, while the embodiments are described in connection with 3D-NAND flash memory devices, the disclosure is not so limited. The disclosure is applicable to other semiconductor structures and memory devices, which may employ floating gate structures.

While FIGS. 1-12 show one embodiment of the methods of forming semiconductor structures having an etch stop material that comprises amorphous aluminum oxide and crystalline aluminum oxide, one of ordinary skill in the art will understand that the above-mentioned methods may be utilized for other applications and structures. Indeed, the methods of the present disclosure are not limited to the semiconductor structures having an etch stop material that comprises amorphous aluminum oxide and crystalline aluminum oxide. Rather, the methods of the present disclosure may be used in any situations where an etch stop material comprises a first material and a second material in which the first and second materials are selectively etchable with respect to one another. For instance, the methods of the present disclosure may use other types of etch stop materials as long as the etch stop material comprises a first material and a second material having a wet etch selectivity to the first material. By way of non-limiting example, the etch stop materials may be amorphous aluminum nitride/crystalline aluminum nitride (AlN), or amorphous aluminum oxide nitride/crystalline aluminum oxide nitride (AlON).

A semiconductor structure may comprise an etch stop material between a substrate and a stack of alternating insulating materials and conductive materials over a substrate, and a channel material extending through the stack, wherein the etch stop material comprises a first dielectric material in contact with the substrate and a second dielectric material in contact with the stack of the alternating insulating materials and conductive materials, the first dielectric material having a wet etch selectivity to the second dielectric material.

While the present disclosure is susceptible to various modifications and alternative forms, specific embodiments have been shown by way of example in the drawings and have been described in detail herein. However, the present disclosure is not intended to be limited to the particular forms disclosed. Rather, the present disclosure is to cover all modifications, equivalents, and alternatives falling within the scope of the present disclosure as defined by the following appended claims and their legal equivalents.

What is claimed is:

1. A method of fabricating a semiconductor structure, the method comprising:
    forming an etch stop material between a substrate and a stack of alternating insulating materials and first conductive materials, the etch stop material comprising an amorphous aluminum oxide in contact with the substrate and a crystalline aluminum oxide in contact with the amorphous aluminum oxide;
    forming an opening through the stack of alternating insulating materials and first conductive materials;
    selectively removing a portion of each of the first conductive materials relative to adjacent alternating insulating materials in the stack to form a plurality of first recesses adjacent each of the first conductive materials;
    extending a depth of the opening into the crystalline aluminum oxide and the amorphous aluminum oxide to form a second recess in the amorphous aluminum oxide;
    filling the second recess with an oxide material and a nitride material; and
    filling the plurality of first recesses with a second conductive material.

2. The method of claim 1, wherein forming an etch stop material between a substrate and a stack of alternating insulating materials and first conductive materials comprises forming the amorphous aluminum oxide over the substrate at a temperature of up to about 450° C.

3. The method of claim 1, wherein selectively removing a portion of each of the first conductive materials relative to adjacent alternating insulating materials in the stack to form a plurality of first recesses adjacent each of the first conductive materials comprises laterally recessing each of the first conductive materials relative to the insulating materials.

4. The method of claim 1, wherein selectively removing a portion of each of the first conductive materials relative to adjacent alternating insulating materials in the stack to form a plurality of first recesses adjacent each of the first conductive materials comprises selectively removing the portion of each of the first conductive materials without removing a portion of each of the insulating materials.

5. The method of claim 4, wherein selectively removing a portion of each of the first conductive materials relative to adjacent alternating insulating materials in the stack to form a plurality of first recesses adjacent each of the first conductive materials comprises selectively removing the portion of each of the first conductive materials using a solution of tetramethylammonium hydroxide (TMAH).

6. The method of claim 1, further comprising selectively forming a dielectric material over the first conductive materials.

7. The method of claim 1, wherein extending the depth of the opening into the crystalline aluminum oxide and the amorphous aluminum oxide to form a second recess in the amorphous aluminum oxide comprises exposing the crystalline aluminum oxide and the amorphous aluminum oxide to an aqueous solution of hydrofluoric acid at a 2000:1 ratio (deionized water : HF).

8. The method of claim 1, wherein filling the second recess with an oxide material and a nitride material comprises filling the second recess prior to filling the plurality of first recesses with the second conductive material.

9. The method of claim 1, wherein extending the depth of the opening into the crystalline aluminum oxide and the amorphous aluminum oxide to form a second recess in the amorphous aluminum oxide comprises forming the second recess at an interface between the amorphous aluminum oxide and the crystalline aluminum oxide.

10. The method of claim 1, wherein extending the depth of the opening into the crystalline aluminum oxide and the amorphous aluminum oxide to form a second recess in the amorphous aluminum oxide comprises forming the second recess laterally adjacent the amorphous aluminum oxide.

11. The method of claim 1, wherein extending the depth of the opening into the crystalline aluminum oxide and the amorphous aluminum oxide to form a second recess in the amorphous aluminum oxide comprises recessing the amorphous aluminum oxide relative to the crystalline aluminum oxide.

12. The method of claim 1, wherein the first and second conductive materials are independently selected from the group consisting of n-doped polysilicon, p-doped polysilicon, and undoped polysilicon.

13. A method of fabricating a flash memory device, the method comprising:
    forming an etch stop material between a substrate and a stack of alternating first oxide materials and first polysilicon materials, the etch stop material comprising an amorphous aluminum oxide on the substrate and a crystalline aluminum oxide in contact with the stack;
    forming an opening through the stack and the etch stop material;
    laterally removing portions of the first polysilicon materials relative to adjacent alternating first oxide materials in the stack to leave the adjacent alternating first oxide materials extending beyond the remaining first polysilicon materials and create a plurality of first recesses adjacent the first polysilicon materials;
    selectively removing a portion of the amorphous aluminum oxide to form a second recess adjacent the amorphous aluminum oxide;
    forming a second oxide material on sidewalls of the first polysilicon material in the plurality of first recesses;
    forming a nitride material substantially conformally in the opening and forming a third oxide material over the nitride material to fill the second recess; and
    filling the plurality of first recesses with polysilicon to form a plurality of floating gates.

14. The method of claim 13, wherein forming a nitride material substantially conformally in the opening and forming a third oxide material over the nitride material comprises filling the second recess with the nitride material and the third oxide material, and partially filling the plurality of first recesses with the nitride material and the third oxide material.

15. The method of claim 13, wherein forming an opening through the stack and the etch stop material comprises forming the opening having an aspect ratio of at least 20:1.

16. A method of fabricating a semiconductor structure, the method comprising:
- forming an etch stop material between a substrate and a stack of alternating insulating materials and conductive materials, the etch stop material comprising an amorphous aluminum oxide in contact with the substrate and a crystalline aluminum oxide in contact with the stack;
- forming an opening through the stack and at least a portion of the etch stop material;
- laterally removing portions of the conductive materials to form first recesses adjacent the conductive materials;
- selectively removing portions of the amorphous aluminum oxide to form second recesses adjacent the amorphous aluminum oxide;
- filling the second recesses with at least one dielectric material;
- filling the first recesses with a floating gate material; and
- forming a channel material extending through the stack of alternating insulating materials and conductive materials and into at least a portion of the etch stop material.

17. The method of claim 16, wherein filling the first recesses with a floating gate material comprises filling the first recesses with the floating gate material without filling the floating gate material in the second recesses.

18. The method of claim 16, wherein the method comprises filling the second recesses with the at least one dielectric material prior to filling the first recesses with the floating gate material.

19. The method of claim 16, further comprising forming at least one dielectric material between the floating gate material and the adjacent conductive material.

20. The method of claim 16, further comprising, prior to filling the first recesses with the floating gate material:
- forming a first dielectric material on sidewalls of the conductive materials in the first recesses;
- forming a second dielectric material substantially conformally in the opening; and
- forming a third dielectric material over the second dielectric material.

* * * * *